US008044654B2

(12) United States Patent
Kapusta, Jr.

(10) Patent No.: US 8,044,654 B2
(45) Date of Patent: Oct. 25, 2011

(54) ADAPTIVE BIAS CURRENT GENERATOR METHODS AND APPARATUS

(75) Inventor: Ronald A. Kapusta, Jr., Waltham, MA (US)

(73) Assignee: Analog Devices, Inc., Norwood, MA (US)

( * ) Notice: Subject to any disclaimer, the term of this patent is extended or adjusted under 35 U.S.C. 154(b) by 743 days.

(21) Appl. No.: 12/152,941

(22) Filed: May 19, 2008

(65) Prior Publication Data

US 2008/0284406 A1 Nov. 20, 2008

Related U.S. Application Data

(60) Provisional application No. 60/930,893, filed on May 18, 2007.

(51) Int. Cl.
*B23K 11/24* (2006.01)
*H02J 1/00* (2006.01)
*H02J 3/12* (2006.01)
*G05B 24/02* (2006.01)

(52) U.S. Cl. ....................................................... 323/318

(58) Field of Classification Search .......... 323/312–315, 323/318
See application file for complete search history.

(56) References Cited

U.S. PATENT DOCUMENTS

| | | | |
|---|---|---|---|
| 3,848,195 A | | 11/1974 | Kiko |
| 4,851,719 A | * | 7/1989 | Hitomi ............................. 327/58 |
| 5,247,241 A | * | 9/1993 | Ueda ............................. 323/312 |
| 5,339,019 A | * | 8/1994 | Benz ............................. 323/312 |
| 6,144,249 A | * | 11/2000 | Tse ............................. 323/316 |
| 6,407,623 B1 | | 6/2002 | Bazarjani et al. |
| 6,535,039 B2 | | 3/2003 | Nanba et al. |
| 6,552,676 B1 | | 4/2003 | Bjorksten et al. |
| 7,002,501 B2 | | 2/2006 | Gulati et al. |
| 2005/0140422 A1 | | 6/2005 | Klemmer |

FOREIGN PATENT DOCUMENTS

EP 1168603 1/2002

OTHER PUBLICATIONS

Anderson et al.., A Cost-Effective High-Speed 12-bit Pipeline ADC in 0.18-um Digital CMOS, IEEE Journal of Solid-State Circuits, Jul. 2005, pp. 1506-1513, vol. 40, No. 7.

* cited by examiner

*Primary Examiner* — Jue Zhang
(74) *Attorney, Agent, or Firm* — Knobbe, Martens, Olson & Bear, LLP

(57) ABSTRACT

In one aspect, a method of reducing power consumption in a circuit by adaptive bias current generation of a bias current configured to bias, at least in part, at least one amplifier of the circuit is provided. The method comprises establishing the bias current based, at least in part, on a reference frequency of a reference clock providing a clock signal to at least one component of the circuit, and changing the bias current in response to a change in the reference frequency of the at least one reference clock, the bias current being change non-linearly with respect to the change in the reference frequency of the at least one reference clock. In another aspect, the method comprises establishing the bias current based, at least in part, on a capacitance of a reference capacitor, and changing the bias current in response to a change in the capacitance of the reference capacitor such that the bias current is changed non-linearly with respect to changes in the capacitance of the reference capacitor.

29 Claims, 5 Drawing Sheets

ADAPTIVE BIAS CURRENT GENERATOR METHODS AND APPARATUS

RELATED APPLICATIONS

This application claims the benefit under 35 U.S.C. §119 (e) of U.S. Provisional Application 60/930,893, filed May 18, 2007, entitled "NON-LINEAR ADAPTIVE BIAS GENERATION TECHNIQUES," by Kapusta, which is herein incorporated by reference in its entirety.

FIELD OF THE INVENTION

The present disclosure is directed to bias current generation, and more particularly, to bias currents generated to bias one or more amplifiers.

BACKGROUND OF THE INVENTION

Many electronic devices rely on analog-to-digital (A/D) converters to convert an analog signal into a digital signal. Some applications may require different conversion speeds for the same A/D converter. For example, an A/D converter integrated in a digital camera may be required to operate at different speeds depending on the mode of the camera. When the digital camera is operating in high resolution mode, the A/D converter may be required to operate at a higher sample rate than when the digital camera is operating in a low resolution mode. In conventional implementations, the A/D converter is typically designed to operate adequately at the highest required operating speed. In particular, the A/D converter is designed to dissipate enough power to operate correctly at the maximum operating speed.

However, the conventional A/D converter will use the same amount of power when operating at sample rates that are less than the maximum. As a result, the A/D converter dissipates more power than required whenever it operates at less than the maximum operating speed. As a result, the electronic device will dissipate excess power under such conditions. Such is the case for many other circuits, for example, power amplifiers in cellular telephones that operate at different speeds under certain conditions. For example, the cellular phone may operate at a relatively slow speed when in a sleep mode, and operate at a relatively high speed when in an active mode (e.g., when the phone is receiving or initiating a phone call). Accordingly, such circuits will have sub-optimal power consumption when implemented with constant bias currents.

Designing a circuit may require consideration of a number of things that can vary. For example, when a circuit or device is manufactured, there will be some variation in the process. Manufacture of electronic components and/or fabrication of a circuit or device will often cause the operating parameters of the electronic components to deviate from their nominal value, and also deviate from fabrication to fabrication. In addition, the operating parameters of electronic components may vary according to processing conditions of the device. During the design of the circuit, each of the electronic components may be characterized and simulated. To avoid circuit malfunction, the power consumption of the circuit must be sufficient to operate under worst case conditions. Accordingly, the circuit will dissipate the maximum power required under worst case conditions even when conditions require substantially less power.

SUMMARY OF THE INVENTION

Aspects of Applicant's contribution to the art include methods and apparatus for reducing power consumption in electronic devices by adaptively changing one or more bias currents of the device based on conditions in the electronic device. Some embodiments include a method of reducing power consumption in a circuit by adaptive bias current generation of a bias current configured to bias, at least in part, at least one amplifier of the circuit, the method comprising establishing the bias current based, at least in part, on a reference frequency of a reference clock providing a clock signal to at least one component of the circuit, and changing the bias current in response to a change in the reference frequency of the at least one reference clock, the bias current being change non-linearly with respect to the change in the reference frequency of the at least one reference clock.

Some embodiments include a circuit having a plurality of electronic components, the circuit comprising a reference clock that provides a clock signal to at least one of the plurality of components, at least one amplifier biased, at least in part, by a bias current, and a generator circuit for generating the bias current based, at least in part, on a reference frequency of the reference clock, the generator circuit configured to change the bias current in response to a change in the reference frequency of the reference clock such that the bias current is changed non-linearly with respect to changes in the reference frequency of the reference clock Some embodiments include a method of reducing power consumption in a circuit by adaptive bias current generation of a bias current configured to bias, at least in part, at least one amplifier of the circuit, the method comprising establishing the bias current based, at least in part, on a capacitance of a reference capacitor, and changing the bias current in response to a change in the capacitance of the reference capacitor such that the bias current is changed non-linearly with respect to changes in the capacitance of the reference capacitor.

Some embodiments include a circuit having a plurality of electronic components, the circuit comprising a reference capacitor having a reference capacitance, at least one amplifier biased, at least in part, by a bias current, and associated with a load capacitance similar to the reference capacitance of the reference capacitor, and a generator circuit for generating the bias current based, at least in part, on the reference capacitance of the reference capacitor, the generator circuit configured to change the bias current in response to a change in the reference capacitance of the reference capacitor such that the bias current is changed non-linearly with respect to changes in the capacitance of the reference capacitor.

DETAILED DESCRIPTION

Figure 1A:
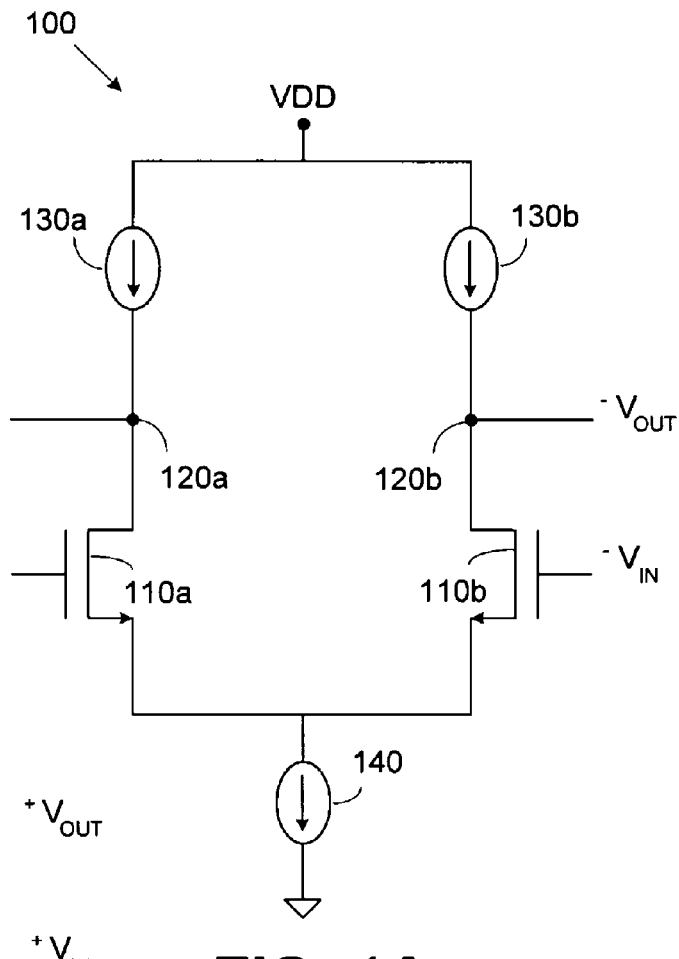
FIG. 1A illustrates a basic amplifier circuit.

A/D converters are often built with a number of amplifiers, which are in turn biased with current reference circuits. The bias current of an amplifier is related to the bandwidth of the amplifier; the larger the bias current, the wider the bandwidth. The settling time of an amplifier is proportional to the bandwidth of the amplifier. As a result, bias current implicates an amplifier settles, and therefore how fast the A/D converter may operate. For example, an amplifier might require high bias current for the maximum sample rate, but the bias current could be reduced for lower sample rates. However, many conventional A/D converters maintain the bias current necessary to achieve the maximum required operating speeds (e.g., the maximum sample rate required of the A/D converter). Accordingly, when the A/D converter is operating at lower operating speeds, the bias current is unnecessarily high, resulting is excess power dissipation.

Applicant has appreciated that by varying the bias current of an amplifier based, at least in part, on the operating speed of a circuit, power consumption may be made more optimal. In some embodiments, the bias current is varied in non-linear proportion to the frequency of a reference clock on which at least some components of the circuit operate. For example, in some embodiments, the bias current may be varied according to a squared relationship with the frequency of the reference clock. However, other non-linear relationships between bias current and clock frequency may be used, as the aspects of the invention are not limited in this respect.

Depending on the type of reference circuit, bias currents are often made to be constant over processing conditions, temperature, and supply voltages. However, the required bias currents of many circuits are not constant over these conditions. Similarly, switched capacitor amplifiers are often required to settle capacitive loads, but the bias current stays constant regardless of capacitance process variation. As discussed above, prior art bias current generator circuits typically establish bias currents based on the "worst case" operating conditions, and do not change the bias current when conditions improve. This results in an inefficient use of power. For example, circuits typically must be designed to provide a bias current sufficient to support worst case manufacturing tolerances, and sufficient to support worst case operating conditions. Thus, when actual circuits are fabricated that do not exhibit worst case tolerances and/or when the circuit is operating under conditions better than worst case, the circuit will operate wastefully from a power consumption standpoint.

Applicant has appreciated that improved power efficiency may be achieved by generating adaptive bias currents based on one or more properties of components in the circuit. For example, in some embodiments, one or more bias currents are established based on an actual manufactured component in the circuit in which the bias currents are being provided and/or varied in response to changes in the one or more properties. In some embodiments, a bias current may be varied according to an actual capacitance value of a reference capacitor implemented to reflect the properties of one or more load capacitors. In addition, the bias current may be varied according to changes in the capacitance, as discussed in further detail below. It should be appreciated that the bias current may be varied as a result of parameters from other electronic components and/or other properties of a reference capacitor, as the aspects the invention are not limited in this respect.

FIG. 1A illustrates a basic differential amplifier. Amplifier 100 includes two input devices 110a and 110b, connected to $^+V_{IN}$ and $^-V_{IN}$, respectively. Amplifier 100 also includes differential output nodes 120a and 120b providing $+V_{OUT}$ and $-V_{OUT}$, respectively. Two current sources 130a and 130b are connected to VDD and provide load currents, and current source 140 provides a tail current connected to ground.

Assuming that $^+V_{IN}$ and $^-V_{IN}$ are approximately equal, approximately half of the tail current will be flowing through each of the input devices 110a and 110b. That is, the drain currents ID through the input devices 110a and 110b are approximately equal to the tail current divided by two.

Figure 1B:
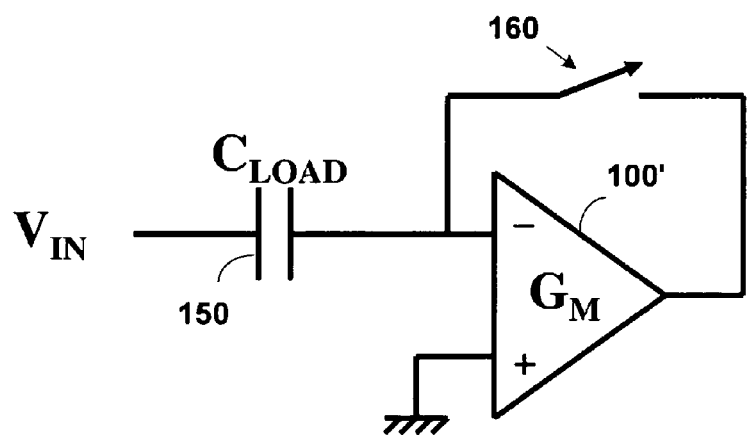
FIG. 1B illustrates an amplifier arranged in a switched capacitor configuration.

The transconductance of amplifier 100 can be expressed as, $$G_M = g_m * X \quad (1),$$

where $G_M$ is the overall amplifier transconductance, $g_M$ is the transconductance of the input devices, and X is some multiplier that depends on the amplifier configuration. In basic amplifier 100, X is substantially equal to unity. When the input devices are MOS devices, $g_M$ can be expressed as, $$g_M = \sqrt{\frac{W}{L} * K * I_D}, \quad (2)$$

where W and L are the dimensions of the MOS device, K is a constant that is related to processing conditions, and $I_D$ is the drain current. It should be appreciated that the overall amplifier transconductance $G_M$ is related to the amplifier bandwidth. FIG. 1B illustrates an amplifier configured in a switched capacitor configuration. In particular, amplifier 100', with transconductance $G_{M'}$, has an input voltage $V_{IN}$ connected to the negative terminal through a load capacitor 150 having a capacitance $C_{LOAD}$, and the positive terminal connected to ground. The output of amplifier 100' is fed back to the negative terminal via switch 160 to stabilize the amplifier. Switch 160 may operate according to some clock signal. For example, the switched capacitor circuit illustrated in FIG. 1B may be a sample-and-hold circuit in an A/D converter, and the switch may operate off of the sample clock. Amplifier 100' may be similar to amplifier 100 illustrated in FIG. 1A, and therefore is biased by a bias current. In the switched capacitor amplifier configuration of FIG. 1B, the bandwidth of the amplifier may be expressed as, $$BW = \frac{G_M}{C_{LOAD}}, \quad (3)$$

where BW is the bandwidth of the amplifier and $C_{LOAD}$ is the capacitance of load capacitor 130 connected to the amplifier. Using Equations (1) and (2), the bandwidth can be expressed as, $$BW = \frac{\sqrt{K_0 * I_D}}{C_{LOAD}}, \quad (4)$$

where $K_0$ is the constant $$\frac{W}{L} * K.$$

Ignoring the constant $K_0$, the bandwidth for the amplifier may be expressed as, $$BW \propto \sqrt{I_D}, \frac{1}{C_{LOAD}}. \qquad (5)$$

That is, the bandwidth of the amplifier is proportional to the square root of the bias current and proportional to 1 over the capacitance $C_{LOAD}$. Rearranging proportion (5), the drain current (or bias current) may be expressed as, $$I_D \propto BW^2 \qquad (6),$$

and $$I_D \propto C_{LOAD}^2. \qquad (7).$$

That is, the bias current is related to the square of the bandwidth, and the square of the capacitive load. For example, if twice as much bandwidth is required, the bias current must be quadrupled. It should be appreciated from this equation the significant amount of wasteful power that may be consumed by a circuit designed to operate with constant bias currents for all operating conditions. For example, a circuit that operates at two different frequencies wherein one is twice as fast as the other will have to have quadruple the bias current to make sure that the circuit operates correctly at the higher frequency, even though much of the time the circuit may be operating at the lower frequency. Similarly, circuits designed to handle worst case manufacturing tolerances will result in squared bias current requirements for changes in capacitor operating values. That is, relatively small deviations from nominal in the manufacturing process and/or small changes resulting from process variation will have to be accounted for by squared relationship increases in bias current.

For optimally biased circuits, the minimum bandwidth required for any given operating frequency is desirable. Therefore, according to the above equations, as operating frequency increases or decreases by some changer f_delta, the bias current for the amplifiers should be increased or decreased by (f_delta)², respectively. In this condition, power would be substantially minimized for any operating frequency. Similarly, according to the above equations, bias current should be varied relative to changes in load capacitance. If load capacitance increases or decreases by some change c_delta, the bias current for the amplifiers should be increased or decreased by (c_delta)². In this condition, power would be substantially minimized for any operating frequency.

While the above equations and proportions are approximate, Applicant's insight provides that in order to establish more optimal power consumption, bias currents should be varied according to a non-linear relationship with operating frequency and/or capacitive load. Another way to state this insight is that bias currents should be adjusted to keep a transconductance of an electronic component (e.g., the transconductance of a transistor, or an amplifier) proportional to operating frequency to generally realize more optimal power consumption.

Figure 2A:
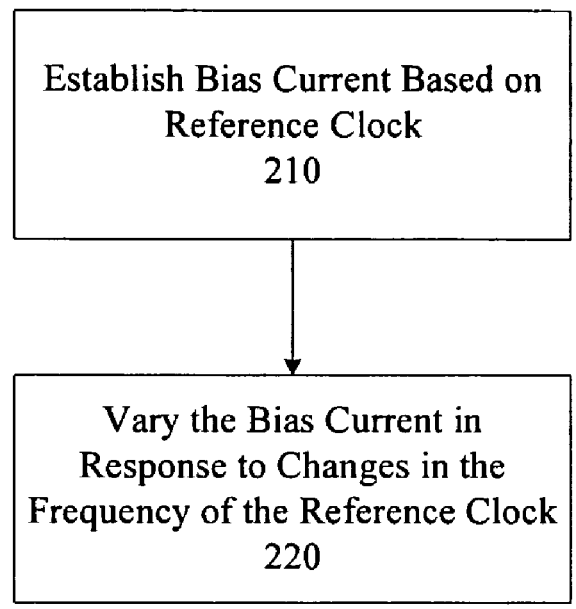
FIG. 2A and 2B illustrate respective methods for adaptive bias current generation, in accordance with some embodiments of the present invention.

FIG. 2A illustrates a method of adaptive bias current generation to facilitate reducing power consumption of a circuit, in accordance with some embodiments of the present invention. The method may be applied, for example, in a circuit that operates, at least in part, according to a reference clock. The reference clock may operate at different frequencies depending on the speed requirements of the circuit. In some embodiments, the circuit may include one or more amplifiers that operate using a bias current. As discussed above, the strength of the bias current is related to how fast the amplifier can settle, and therefore relates to the speed at which the circuit can operate.

In act 210, one or more bias currents is established based, at least in part, on a frequency of a reference clock that operates at least some components in a circuit. For example, the frequency of the reference clock may be used as an indicator of the operating speed of the circuit and the one or more bias currents set appropriately. In act 220, the one or more bias currents is varied in response to a change in the frequency of the reference clock. In some embodiments, the one or more bias currents are varied non-linearly with changes in the frequency of the reference clock. For example, as the frequency of the reference clock increases to accommodate a higher operating speed, the one or more bias currents are non-linearly increased so that components operating off the one or more bias currents may operate correctly (e.g., have fast enough settling times) at the increased operating speed.

Likewise, as the frequency of the reference clock decreases when, for example, the increased operating speed is no longer required, the one or more bias currents are non-linearly decreased so that the components using the one or more bias currents operate correctly but do not waste excess power that would have been dissipated had the bias currents remained constant. In some embodiments, the one or more bias currents have approximately a squared relationship with changes in the frequency of the reference clock. However, the non-linear relationship is not limited to a squared relationship as other non-linear relationships (e.g., higher order relationships) may be used as well.

As discussed above, constant bias currents may cause waste in power consumption when designed to handle worst case fabrication processes and/or worst case operating conditions. In some embodiments, a bias current is established based on the capacitance of a reference capacitor reflective of one or more load capacitors in the circuit, and varied in response to changes in the capacitance. The reference capacitor is preferably a capacitor manufactured under the same conditions as the load capacitors (e.g., fabricated in the same device and under the same conditions and specifications), and arranged in the circuit such that the reference capacitor is subject to at least some of the same process variation as the load capacitors.

Figure 2B:
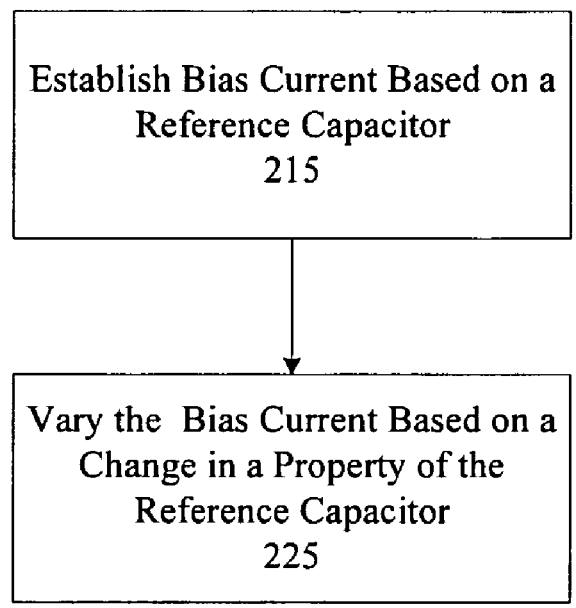

FIG. 2B illustrates a method of adaptive bias current generation to facilitate reducing power consumption of a circuit, in accordance with some embodiments of the present invention. The method may be applied in a circuit where the operating speed relates to one or more load capacitors, and one or more reference capacitors have been implemented to reflect the operating parameters of the load capacitors. In act 215, a bias current is established based on a capacitance of the reference capacitor. As discussed above, it may be preferable to obtain a reference capacitor that reflects as closely as possible the manufacturing tolerances and fabrication processes experienced by the load capacitors. Accordingly, since the reference capacitor may be fabricated under the same conditions as the load capacitors, the bias currents need not be established to handle worst case fabrication conditions, but rather can be established based on the actual properties of the fabricated components.

In some embodiments, the reference capacitor is arranged in the circuit such that it experiences at least some of the same process variation as the load capacitors. In act 225, the one or more bias currents are varied in response to changes to one or more properties of the reference capacitor (e.g., changes to the capacitance of the reference capacitor resulting from process variation). In some embodiments, the one or more bias currents are varied according to a non-linear relationship with changes to the capacitance of the reference capacitor. Thus, as conditions change within the circuit, the at least one bias currents can be varied non-linearly according to changes in the reference capacitor. As a result, bias currents may be adapted to reduce excess power consumption as conditions change within the circuit. In some embodiments, the one or more bias currents have approximately a squared relationship with changes in capacitance of the reference capacitor. However, the non-linear relationship is not limited to a squared relationship as other non-linear relationships (e.g., higher order relationships) may be used as well.

While the methods illustrated in FIGS. 2A and 2B may be used alone, some embodiments include establishing and varying one or more bias currents based both on the frequency of a reference clock and on one or more properties of a reference capacitor (e.g., capacitance). One aspect of the invention relates to a circuit that generates a bias current that is proportional to the square of the frequency of a reference clock, and also proportional to the square of the value of a reference capacitor. If the frequency of the reference clock and the capacitor are the same or similar to the operating frequency and load capacitance of amplifiers the circuit, for example, then the amplifiers will be more optimally biased than in conventional circuits.

Figure 3:
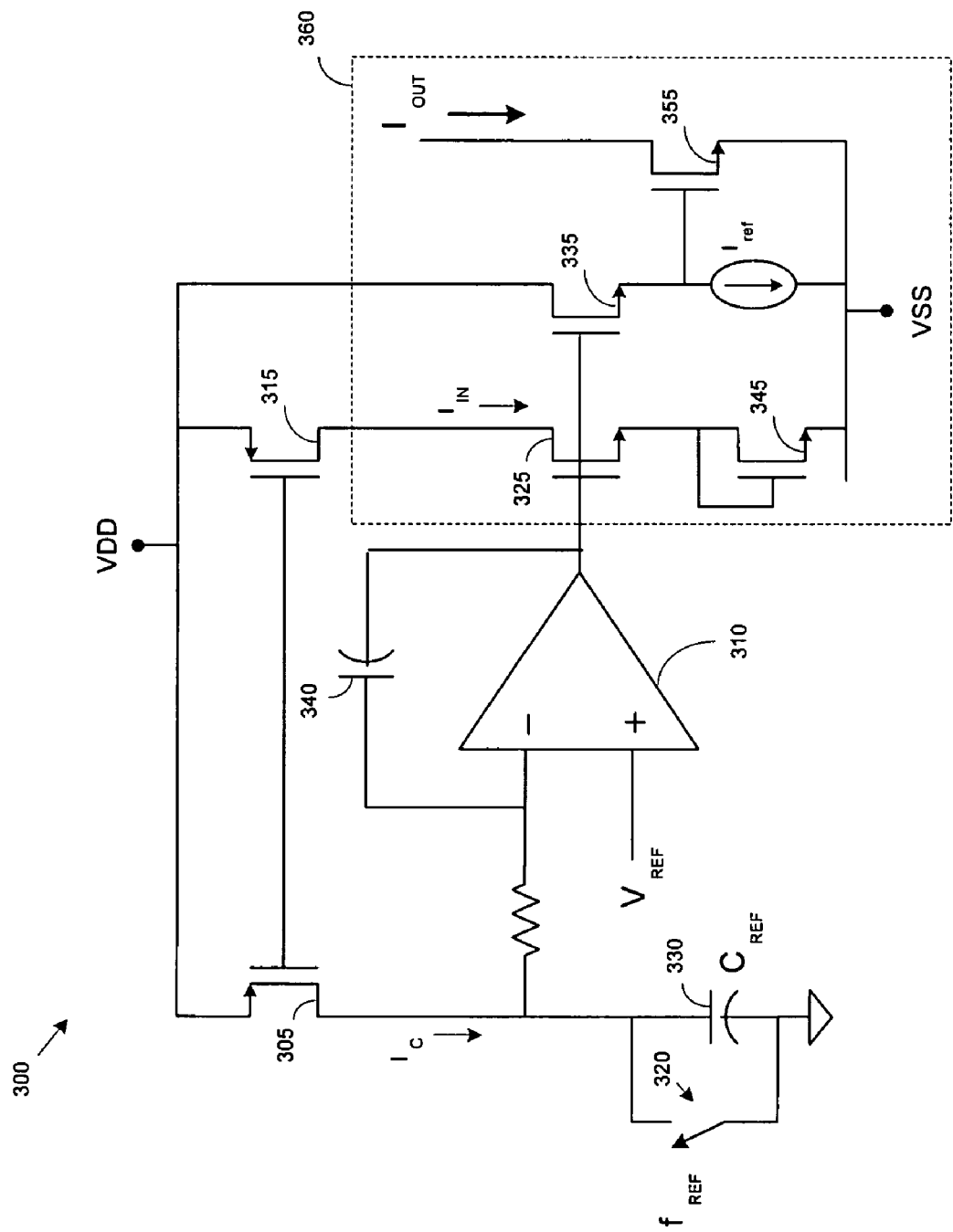
FIG. 3 illustrates a circuit that implements adaptive bias current generation techniques, in accordance with some embodiments of the present invention.

FIG. 3 is a schematic of a generator circuit for generating a bias current having adaptive bias with non-linear dependence on the frequency of a reference clock and a reference capacitance. The generator circuit 300 includes an amplifier 310 having a resistor 350 connected to the negative terminal, a reference voltage $V_{REF}$ connected at the positive terminal, and a feedback connection to the negative terminal through capacitor 340. This amplifier configuration acts as an integrator block. Generator circuit 300 also includes a switched-capacitor circuit comprising a switch 320 and capacitor 330. Switch 320 may be connected to a reference clock such that the switch opens and closes at the frequency of the reference clock ($f_{REF}$). Accordingly, when switch 320 is open, capacitor 330 is charged up via VDD and transistor 305 (which operates as a current source). When the switch is closed, capacitor 330 discharges through the switch to ground. Accordingly, capacitor 330 charges and discharges according to the frequency of the reference clock.

Amplifier 310 is also connected to translinear circuit 360, which, in connection with the switched-capacitor circuit (i.e., connected to VDD through transistors 305 and 315) cause a bias current $I_{OUT}$ to be related to the frequency of the reference clock $f_{REF}$ applied to switch 320, as well as the absolute capacitance value $C_{REF}$ of capacitor 330. That is, circuit 300 generates a bias current $I_{OUT}$, wherein, $$i\ I_{OUT} \propto (V_{REF} * C_{REF} * F_{REF})^2 \qquad (8).$$

In particular, translinear circuit 360 applies the well-known translinear principle, wherein the output current ($I_{OUT}$) of the circuit is approximately equal to the square of the input current ($I_{IN}$) divided by a reference current ($I_{REF}$). This is referred to as a "square-law dependence." Although this is one such circuit arrangement wherein this relationship holds, other circuit arrangements are possible that provide a non-linear relationship between a clock frequency and a generated bias or output current. As the frequency of the clock changes (e.g., the operating speed is increased or decreased depending on the operating requirements of a circuit in which generator circuit 300 is implemented), the bias current will automatically be adjusted to maintain the square-law relationship. By varying the bias current with operating frequency, power consumption may be made more optimal.

In addition, generator circuit 300 also produces a bias current related to the square of the capacitance $C_{REF}$ of capacitor 330. As discussed above, capacitor 330 is charged and discharged according to the frequency $f_{REF}$. The amplifier circuit, connected to the switched capacitor circuit, forces the average voltage value stored on capacitor 330 to be equal to $V_{REF}$. For example, if the voltage waveform on capacitor 330 were a triangle waveform, it would charge up from zero to $2V_{REF}$ and discharge back to zero. It should be appreciated that the waveform may not be a triangle waveform and such a waveform was mentioned to describe a simplistic situation to assist in an understanding of the operation of the circuit.

The charge on the capacitor 330 is $C_{REF}$ times the voltage across the capacitor, the average value of which is forced to be $V_{REF}$ by the amplifier circuit. Accordingly, the current required to charge the capacitor is related to $C_{REF}$. That is, if $C_{REF}$ is doubled, the current $I_c$ (which is reflected in $I_{IN}$) must be doubled to maintain the voltage waveform enforced by the amplifier circuit. As a result, forcing the average voltage on capacitor 330 to equal $V_{REF}$ causes the current $I_{IN}$ to be proportional to the capacitance $C_{REF}$, which in turn causes the bias current $I_{OUT}$ to have a squared relationship with the capacitance.

As discussed above, fabricating electronic components results in slight deviations from previous and successive fabrication processes. Accordingly, by making the bias current dependent on $C_{REF}$ of capacitor 330, capacitor 330 can be manufactured to be the same as the load capacitors, for example, of switched capacitor circuits performing signal processing for which the bias current is generated. As a result, fabrication deviations will be incorporated into capacitor 330 and the generator circuit 300 will automatically account for these deviations. In addition, if capacitor 330 is implemented such that it experiences at least some of the process variation as the load capacitors, during operation, changes in the operating parameters of the load capacitors will be reflected in capacitor 330 and the bias current will automatically adapt.

Accordingly, generator circuit 300 provides an adaptive bias current that is established based on clock frequency and load capacitance, and is varied according to a non-linear relationship with both clock frequency and load capacitance. The adaptive bias current facilitates operation of a signal processing circuit that can deliver appropriate power when operating conditions require an increase, but that also adaptively decrease when operating conditions are such that less power is required, resulting in a more power efficient circuit. In some embodiments, the bias currents generated by a generator circuit according to aspects of the invention are used to drive amplifiers in a switched-capacitor circuit that implements an A/D converter. However, aspects of the invention are not limited in this respect and can be implemented in any circuit that may benefit from adaptive bias currents.

In many A/D converters, and in particular, pipeline A/D converters, alternating stages of the pipeline may operate on alternate half-cycles of a reference clock. For example, during the first half-cycle, stages 1, 3, 5 ... etc., may be performing conversions (e.g., are in MDAC mode) and on the second half-cycle, stages 2, 4, 6, ... etc., may be performing conversions. For example, in phase 1: a stage N is in sample mode, and a stage N+1 is in MDAC mode. In phase 2: stage N is in MDAC mode, and stage N+1 is in sample mode. Thus, half of the stages are converting on one phase of the clock cycle and the other half are converting on the other phase of the clock cycle. For various design reasons, it may be necessary and/or beneficial to have unequal duty cycles for the two phases of the reference clock period. For example, it may benefit a circuit designer to have the first phase occupy 70% of the total clock period and the second phase to occupy 30% of the total clock period. It should be appreciated that the above numbers are merely exemplary and any clock having unequal phase intervals may be used.

Figure 4:
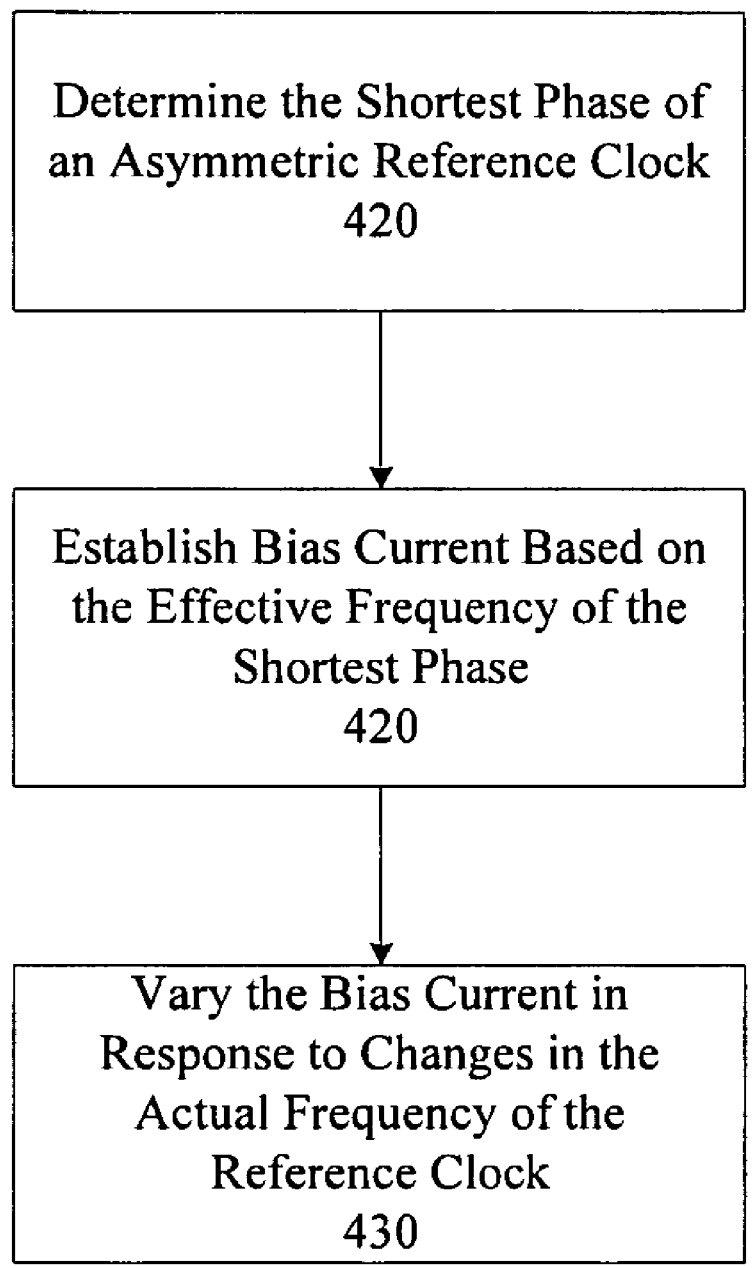
FIG. 4 illustrates a method for adaptive bias current generation based on an asymmetric reference clock, in accordance with some embodiments of the present invention.

As a result, stages that are converting during the shorter clock phase will have to operate faster than the stages converting during the longer clock phase, and thus may require significantly more bias current. Applicant has appreciated that power savings may be achieved by not only adapting bias currents to absolute clock frequency, but also adapting bias currents according to the shortest phase of the clock cycle. FIG. 4 illustrates a method for adapting a bias current based on a reference clock having unequal clock phases, in accordance with some embodiments of the present invention.

FIG. 4 illustrates a method of adaptive bias current generation for circuits operating, at least in part, on a reference clock having unequal clock phases. In act 410, it is determined which phase of the clock cycle is the shortest. The shortest phase may then be used as the effective frequency of the reference clock. In act 420, one or more bias currents are established based on the effective frequency of the shortest phase of the reference clock. In act 430, the one or more bias currents are varied in response to a change in the actual frequency of the reference clock. It should be appreciated that when the actual frequency of the reference clock changes, the effective frequency reflected in the shortest phase will also change. Thus, the one or more bias currents may be adaptively varied according to changes in the clock frequency, based on the shortest phase of the clock cycle.

Figure 5:
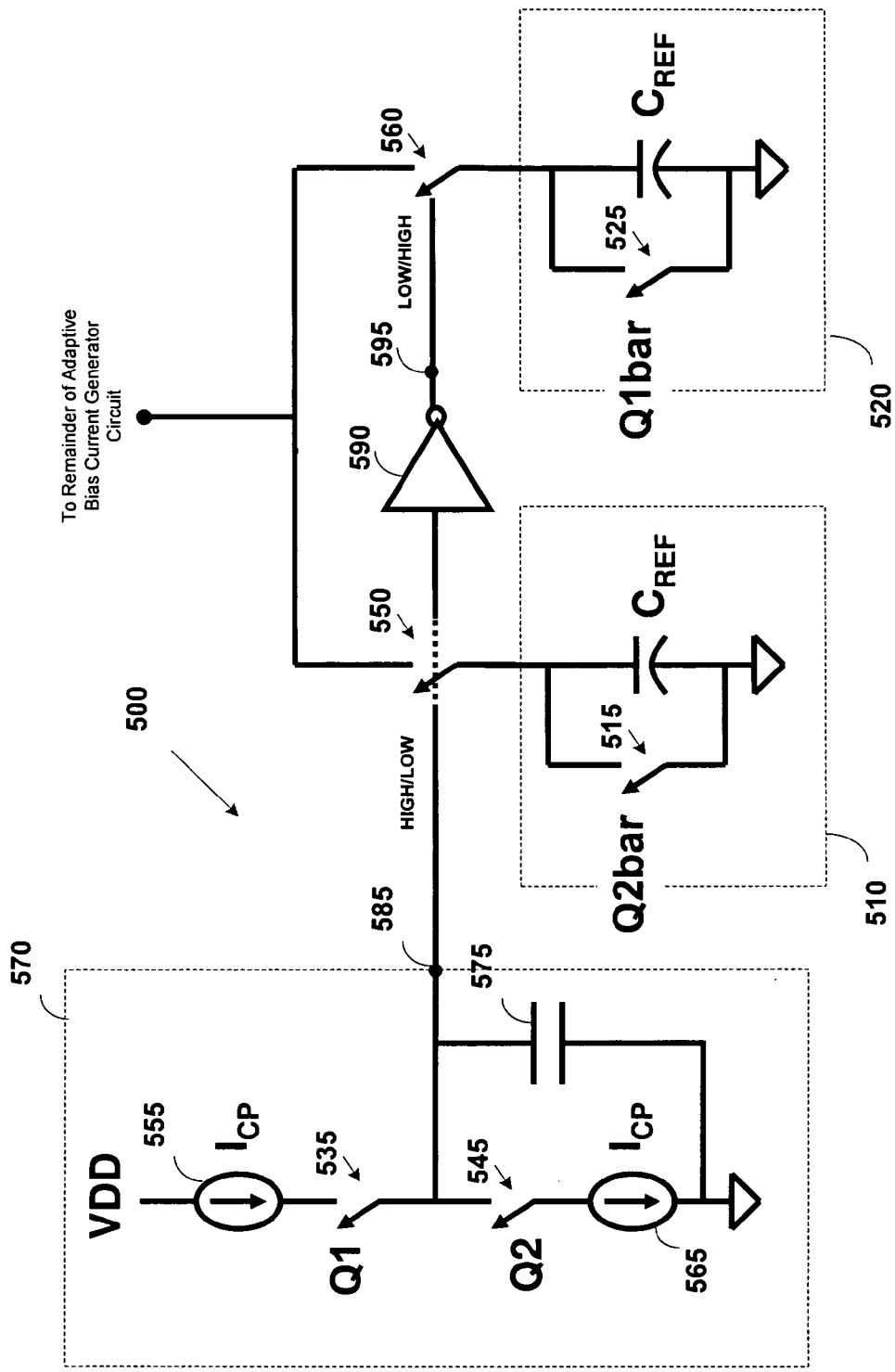
FIG. 5 illustrates a circuit to facilitate adaptive bias current generation based on an asymmetric reference clock, in accordance with some embodiments of the present invention.

FIG. 5 is a diagram of a circuit constructed to generate a bias current proportional to a modified $f_{REF}$ clock, such that the bias current generated is proportional to the duty cycle and the frequency of $f_{REF}$ with respect to the shorter phase of the clock cycle. The selection circuit in FIG. 5 effectively determines which phase of the clock period to use in determining the effective clock frequency, for example, which phase to use as the effective $f_{REF}$ of the clock signal as illustrated in generator circuit 300 of FIG. 3. As a result, bias currents may be adapted according to the frequency of a reference clock (and/or the capacitance of load capacitors) based on the apparent frequency of the shorter phase of the clock cycle.

Circuit 500 includes two switched capacitor circuits 510 and 520, each having a respective switch and capacitor combination similar to the switched capacitor circuit illustrated in FIG. 3 (i.e., switch 320 and capacitor 330). Each of switches 515 and 525 of the respective switched capacitor circuits are operated by a respective one of signals Q1bar and Q2bar, which are the inverse of signals Q1 and Q2 defining two unequal phases of a clock cycle. As shown, each switched capacitor circuit may be connected to the remainder of an adaptive bias current generator circuit through respective switches 550 and 560. As a result, either of the switched capacitor circuits may be connected to drive an adaptive bias current generator circuit.

Selection circuit 570 is adapted to select either switched capacitor circuit 510 or 520 to drive the adaptive bias current generator circuit based on which of the clock phases Q1 and Q2 is shorter. Switches 535 and 545 are controlled by Q1 and Q2, respectively, and are each associated with respective current sources 555 and 565, which in some embodiments are selected to generate currents of substantially the same strength. When switch 535 is closed, capacitor 575 is charged by current source 555, and when switch 565 is closed, capacitor 575 is discharged. The relative difference in the intervals in which Q1 and Q2 close their respective switches, selects which of the switched capacitor circuits will operate the generator circuit by either, over time, charging or discharging capacitor 575.

For example, if the Q1 clock phase is longer than the Q2 clock phase, then switch 535 will be closed for longer periods of time than switch 545 and charge will accumulate on capacitor 575, causing node 585 to be at a high level and node 595 (following inverter 590) to be at a low level. The high level at node 585 will close switch 550 and switched capacitor circuit 510 will drive the adaptive bias generator circuit. To force the capacitor to charge (i.e., an open switch 515) for the relatively short time associated with Q2, the inverse signal Q2bar is applied to close switch 515.

On the other hand, if Q2 is longer, switch 545 will be closed for longer periods of time than switch 535 and capacitor 575 will discharge bringing node 585 to a low level. Inverter 590 will cause node 595 to go high to close switch 560 and switched capacitor circuit 520 will drive the adaptive bias generator circuit. To force the capacitor to charge (i.e., an open switch 525) for the relatively short time associated with Q1, the inverse signal Q1bar is applied to close switch 525. Accordingly, circuit 500, in connection with the adaptive bias current generator shown in FIG. 3 may be used to form an adaptive circuit generator that generates a bias current that adapts to frequency, duty cycle and/or capacitance conditions of a circuit having at least some component biased by the adaptive bias current. It should be appreciated that the circuit illustrated in FIG. 5 can be extended to consider more than two phases of a clock cycle, as the aspects of the invention are not limited in this respect.

It should be appreciated that various aspects of the present invention may be may be used alone, in combination, or in a variety of arrangements not specifically discussed in the embodiments described in the foregoing and is therefore not limited in its application to the details and arrangement of components set forth in the foregoing description or illustrated in the drawings.

The invention is capable of other embodiments and of being practiced or of being carried out in various ways. In particular, numerous other circuit configurations may be designed to implement the various techniques of adaptive bias generation described herein, and the aspects of the present invention are not limited to the particular circuit implementations described herein and illustrated in the drawings.

Various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. A method of reducing power consumption in a circuit by adaptive bias current generation of a bias current configured to bias, at least in part, at least one component of the circuit, the method comprising:

establishing the bias current based, at least in part, on a reference frequency of at least one reference clock providing a clock signal to at least one component of the circuit; and changing the bias current in response to a change in the reference frequency of the at least one reference clock, the bias current being changed non-linearly with respect to the change in the reference frequency of the at least one reference clock;

wherein the reference clock has a plurality of unequal phases, the method further comprising determining a shortest phase of the plurality of unequal phases, wherein the reference frequency is based on the shortest phase.

2. The method of claim 1, wherein changing the bias current includes increasing the bias current in response to an increase in the reference frequency of the at least one reference clock, and decreasing the bias current in response to a decrease in the reference frequency of the at least one reference clock.

3. A method of reducing power consumption in a circuit by adaptive bias current generation of a bias current configured to bias, at least in part, at least one component of the circuit, the method comprising:

establishing the bias current based, at least in part, on a reference frequency of at least one reference clock providing a clock signal to at least one component of the circuit; and changing the bias current in response to a change in the reference frequency of the reference clock, the bias current being changed non-linearly with respect to the change in the reference frequency of the at least one reference clock, wherein changing the bias current includes changing the bias current in a substantially squared relationship with changes in the reference frequency of the reference clock.

4. The method of claim 1, wherein changing the bias current includes changing the bias current to keep a transconductance of the at least one component substantially proportional to the reference frequency.

5. The method of claim 1, wherein establishing the bias current includes establishing the bias current based, at least in part, on a capacitance of a reference capacitor.

6. The method of claim 5, wherein changing the bias current includes changing the bias current in response to a change in the capacitance of the reference capacitor.

7. The method of claim 6, wherein changing the bias current includes increasing the bias current in response to an increase in the capacitance of the reference capacitor, and decreasing the bias current in response to a decrease in the capacitance of the reference capacitor.

8. The method of claim 7, wherein changing the bias current includes changing the bias current non-linearly with respect to changes in the capacitance of the reference capacitor.

9. The method of claim 8, wherein changing the bias current includes changing the bias current in a substantially squared relationship with changes in the capacitance of the reference capacitor.

10. The method of claim 3, wherein the reference clock has a plurality of unequal phases, the method further comprising determining a shortest phase of the plurality of unequal phases, wherein the reference frequency is based on the shortest phase.

11. A circuit having a plurality of electronic components, the circuit comprising:

a reference clock that provides a clock signal to at least one of the plurality of components;

at least one component biased, at least in part, by a bias current; and a generator circuit for generating the bias current based, at least in part, on a reference frequency of the reference clock, the generator circuit configured to change the bias current in response to a change in the reference frequency of the reference clock such that the bias current is changed non-linearly with respect to changes in the reference frequency of the reference clock;

wherein the reference clock has a plurality of unequal phases, and wherein the generator circuit includes a selection circuit to determine a shortest phase of the plurality of unequal phases, wherein the reference frequency is based on the shortest phase.

12. The circuit of claim 11, wherein the generator circuit is configured to increase the bias current in response to an increase in the reference frequency of the reference clock, and decrease the bias current in response to a decrease in the reference frequency of the reference clock.

13. A circuit having a plurality of electronic components, the circuit comprising:

a reference clock that provides a clock signal to at least one of the plurality of components;

at least one component biased, at least in part, by a bias current; and a generator circuit for generating the bias current based, at least in part, on a reference frequency of the reference clock, the generator circuit configured to change the bias current in response to a change in the reference frequency of the reference clock such that the bias current is changed non-linearly with respect to changes in the reference frequency of the reference clock, wherein the generator circuit is configured to change the bias current in a substantially squared relationship with changes in the reference frequency of the reference clock.

14. The circuit of claim 11, wherein the generator circuit is configured to change the bias current to keep a transconductance of the at least one component substantially proportional to the reference frequency of the reference clock.

15. The circuit of claim 11, further comprising a reference capacitor, wherein the generator circuit generates the bias current based, at least in part, on a capacitance of the reference capacitor.

16. The circuit of claim 15, wherein the generator circuit is configured to change the bias current in response to a change in the capacitance of the reference capacitor.

17. The circuit of claim 16, wherein the generator circuit is configured to increase the bias current in response to an increase in the capacitance of the reference capacitor and to decrease the bias current in response to a decrease in the capacitance of the reference capacitor.

18. The circuit of claim 15, wherein the generator circuit is configured to change the bias current non-linearly with respect to changes in the capacitance of the reference capacitor.

19. The circuit of claim 13, wherein the reference clock has a plurality of unequal phases, and wherein the generator circuit includes a selection circuit to determine a shortest phase of the plurality of unequal phases, wherein the reference frequency is based on the shortest phase.

20. The method of claim 3, wherein changing the bias current includes increasing the bias current in response to an increase in the reference frequency of the reference clock, and decreasing the bias current in response to a decrease in the reference frequency of the reference clock.

21. The method of claim 3, wherein changing the bias current includes changing the bias current to keep a transconductance of the at least one component substantially proportional to the reference frequency.

22. The method of claim 3, wherein establishing the bias current includes establishing the bias current based, at least in part, on a capacitance of a reference capacitor.

23. The method of claim 22, wherein changing the bias current includes changing the bias current in response to a change in the capacitance of the reference capacitor.

24. The method of claim 23, wherein changing the bias current includes increasing the bias current in response to an increase in the capacitance of the reference capacitor, and decreasing the bias current in response to a decrease in the capacitance of the reference capacitor.

25. The circuit of claim 13, wherein the generator circuit is configured to increase the bias current in response to an increase in the reference frequency of the reference clock, and decrease the bias current in response to a decrease in the reference frequency of the reference clock.

26. The circuit of claim 13, wherein the generator circuit is configured to change the bias current to keep a transconductance of the at least one component substantially proportional to the reference frequency of the reference clock.

27. The circuit of claim 13, further comprising a reference capacitor, wherein the generator circuit generates the bias current based, at least in part, on a capacitance of the reference capacitor.

28. The circuit of claim 27, wherein the generator circuit is configured to change the bias current in response to a change in the capacitance of the reference capacitor.

29. The circuit of claim 28, wherein the generator circuit is configured to increase the bias current in response to an increase in the capacitance of the reference capacitor and to decrease the bias current in response to a decrease in the capacitance of the reference capacitor.

* * * * *